United States Patent
Zhu et al.

(10) Patent No.: US 9,853,153 B2
(45) Date of Patent: Dec. 26, 2017

(54) METHOD OF MANUFACTURING FIN FIELD EFFECT TRANSISTOR

(71) Applicant: Institute of Microelectronics, Chinese Academy of Sciences, Beijing (CN)

(72) Inventors: Huilong Zhu, Poughkeepsie, NY (US); Zhijiong Luo, Poughkeepsie, NY (US); Haizhou Yin, Poughkeepsie, NY (US); Qingqing Liang, Lagrangeville, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 110 days.

(21) Appl. No.: 14/437,401

(22) PCT Filed: Nov. 27, 2012

(86) PCT No.: PCT/CN2012/085322
§ 371 (c)(1),
(2) Date: Apr. 21, 2015

(87) PCT Pub. No.: WO2014/063402
PCT Pub. Date: May 1, 2014

(65) Prior Publication Data
US 2015/0279992 A1    Oct. 1, 2015

(30) Foreign Application Priority Data
Oct. 23, 2012   (CN) .......................... 2012 1 0407809

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02529* (2013.01); *H01L 21/02532* (2013.01);
(Continued)

(58) Field of Classification Search
CPC .................. H01L 29/41791; H01L 21/823431
See application file for complete search history.

(56) References Cited

U.S. PATENT DOCUMENTS

2009/0184369 A1    7/2009   Zhu
2011/0237046 A1    9/2011   Maszara et al.
(Continued)

FOREIGN PATENT DOCUMENTS

CN    102208349 A    10/2011
CN    102446972 A    5/2012

OTHER PUBLICATIONS

International Preliminary Report on Patentability dated Apr. 28, 2015 in International Application PCT/CN2012/085322.
(Continued)

*Primary Examiner* — Yu-Hsi D Sun
(74) *Attorney, Agent, or Firm* — Pillsbury Winthrop Shaw Pittman LLP

(57) ABSTRACT

The present invention provides a method of manufacturing a fin field effect transistor, comprising: providing an SOI substrate comprising a substrate layer (100), a BOX layer (120) and an SOI layer (130); forming a basic fin structure from an SOI layer; forming source/drain regions (110) on both sides of the basic fin structure; forming a fin structure between the source/drain regions (110) from a basic fin structure; and forming a gate stack across the fin structure. The method of manufacturing a fin field effect transistor provided in the present invention can integrate a high-k gate dielectric layer, a metal gate, and stressed source/drain
(Continued)

regions into the fin field effect transistor to enhance the performance of the semiconductor device.

9 Claims, 9 Drawing Sheets

(51) Int. Cl.
| | | |
|---|---|---|
| *H01L 21/02* | (2006.01) | |
| *H01L 21/311* | (2006.01) | |
| *H01L 21/321* | (2006.01) | |
| *H01L 21/84* | (2006.01) | |
| *H01L 29/06* | (2006.01) | |
| *H01L 29/08* | (2006.01) | |
| *H01L 29/16* | (2006.01) | |
| *H01L 29/161* | (2006.01) | |
| *H01L 21/308* | (2006.01) | |

(52) U.S. Cl.
CPC ...... *H01L 21/311* (2013.01); *H01L 21/32115* (2013.01); *H01L 21/845* (2013.01); *H01L 29/0692* (2013.01); *H01L 29/0847* (2013.01); *H01L 29/161* (2013.01); *H01L 29/1608* (2013.01); *H01L 29/66795* (2013.01); *H01L 29/785* (2013.01); *H01L 21/3083* (2013.01)

(56) References Cited

U.S. PATENT DOCUMENTS

| | | | |
|---|---|---|---|
| 2012/0086053 | A1 | 4/2012 | Tseng et al. |
| 2013/0011984 | A1* | 1/2013 | Wang .............. H01L 21/823412 438/285 |

OTHER PUBLICATIONS

International Search Report and Written Opinion dated Jul. 11, 2013 in International Application PCT/CN2012/085322.

* cited by examiner

METHOD OF MANUFACTURING FIN FIELD EFFECT TRANSISTOR

CROSS REFERENCE TO RELATED APPLICATION

This application is a national stage application, filed under 35 U.S.C. §371, of PCT Application No. PCT/CN2012/085322, filed on Nov. 27, 2012, entitled "METHOD OF MANUFACTURING FIN FIELD EFFECT TRANSISTOR", which claims priority to Chinese Application No. 201210407809.7, filed on Oct. 23, 2012, all of which are hereby incorporated by reference in their entirety.

This application claims the benefits of prior Chinese Patent Application No. 201210407809.7 filed on Oct. 23, 2012, titled "METHOD OF MANUFACTURING FIN FIELD EFFECT TRANSISTOR", which is incorporated herein by reference in its entirety.

TECHNICAL FIELD

The present invention relates to the field of semiconductor technology. In particular, the present invention relates to a method of manufacturing a fin field effect transistor.

BACKGROUND ART

As the channel length of MOSFET (Metal Oxide Semiconductor Field Effect Transistor) continues to shorten, a series of effects that can be neglected in the MOSFET long-channel model become more significant, and even become the dominant factor that affects performance. Such phenomenon is generally referred to as short channel effects. Short channel effects may lead to deterioration of electrical properties of devices, e.g., leading to problems such as reduction of the gate threshold voltage, increase in power consumption, and signal-to-noise ratio (SNR) decline.

In order to suppress short channel effects, the popular idea in the industry is to improve conventional planar devices, reduce the thickness of the channel region, and to eliminate the neutral layer at the bottom of the depletion layer in the channel, so that the depletion layer in the channel can fill up the entire channel region—which may be called fully depleted (Fully Depleted: FD) devices, while conventional planar devices belong to partially depleted (Partially Depleted: PD) devices.

However, the manufacture of a fully depleted device requires very thin thickness of the silicon layer in the channel. Traditional manufacturing processes, especially traditional bulk silicon-based processes can hardly manufacture structures that meet such requirements, or the cost is too high. Even for the emerging SOI (silicon on insulator) technology, the thickness of the channel silicon layer is also difficult to be controlled at a thin level. Regarding the general concept of how to achieve a fully depleted device, the focus of R & D has been shifted to 3D device structures.

3D device structures (which are also referred to as vertical-type devices in some references) refer to structures where the source/drain region of the device and the cross section of the gate are not within the same plane, and actually belong to Fin Field Effect Transistor (FinFET) structures.

After shifting to 3D device structures, since the channel region is independent from these structures rather than included in the bulk silicon or SOI, it is possible to manufacture a fully depleted channel with a very small thickness by means such as etching.

Currently, the 3D semiconductor device as shown in FIG. 16 has been proposed, and the semiconductor device comprises: a semiconductor substrate 020 located on an insulating layer 010; source/drain regions 030 connected to opposite first sides 022 in the semiconductor substrate 020; a gate 040 located on a second side 024 adjacent to the first sides 022 in the semiconductor substrate 020 (the gate dielectric layer and the work function metal layer sandwiched between the gate 040 and the semiconductor substrate 020 are not shown in the figure). In order to reduce the resistance of the source/drain region, the edge portion of the source/drain regions 030 can be extended, i.e., the width of the source/drain region 030 (along the xx' direction) is greater than the thickness of the semiconductor substrate 020. 3D semiconductor structures are expected to be applied in the 22 nm technology node and beyond. As the scaling of device dimension, the short channel effect of 3D semiconductor devices will also become a major factor that affects the device performance.

In order to reduce the short channel effect of the device, as well as to reduce the gate leakage current, a high-k gate dielectric and metal gate process is introduced into planar devices, for example, a post-gate process is used to produce a high-k gate dielectric and metal gate. In order to suppress similar problems of the fin field effect transistor, it is required to integrate the high-k gate dielectric and metal gate process into the manufacturing process of a fin field effect transistor. Furthermore, a strained source/drain region is used in a planar device to apply stress to the channel region so as to increase the mobility of the carrier of the channel region.

SUMMARY OF THE INVENTION

One aspect of the present invention is to provide a method of manufacturing a fin field effect transistor, where the high-k gate dielectric and the metal gate may be integrated into a fin field effect transistor to enhance the performance of the semiconductor device. Further, another aspect of the present invention is to provide a strained source/drain region having stress in a fin field effect transistor.

According to one aspect of the present invention, there is provided a method of manufacturing a fin field effect transistor, comprising the following steps:

Step S101, providing an SOI substrate comprising a substrate layer, a BOX layer and an SOI layer;

Step S102, forming a basic fin structure from an SOI layer;

Step S103, forming source/drain regions on both sides of the basic fin structure;

Step S104, forming a fin structure between source/drain regions from the basic fin structure; and Step S105, forming a gate stack across the fin structure.

In the method of manufacturing a fin field effect transistor provided in the present invention, the source/drain region is formed first and then a fin is formed, where a high-k gate dielectric layer and a metal gate can be integrated into a fin field effect transistor to reduce the short channel effect of the device, thereby facilitating the improvement of the performance of semiconductor devices. Further, the strained source/drain region formed depending on the device types may apply different stress to the fin according to the device types, thereby increasing the mobility of the channel carrier.

BRIEF DESCRIPTION OF THE FIGURES

By reading the detailed description of the non-limiting embodiments made with reference to the following figures, the other features, objects and advantages of the present invention will become more apparent.

The following cross-sectional views are obtained by cutting the formed structures along line AA' or 11" given in the corresponding top view.

The same or similar reference signs in the drawings represent the same or similar parts.

DESCRIPTION OF THE PREFERRED EMBODIMENTS

Figure 1:
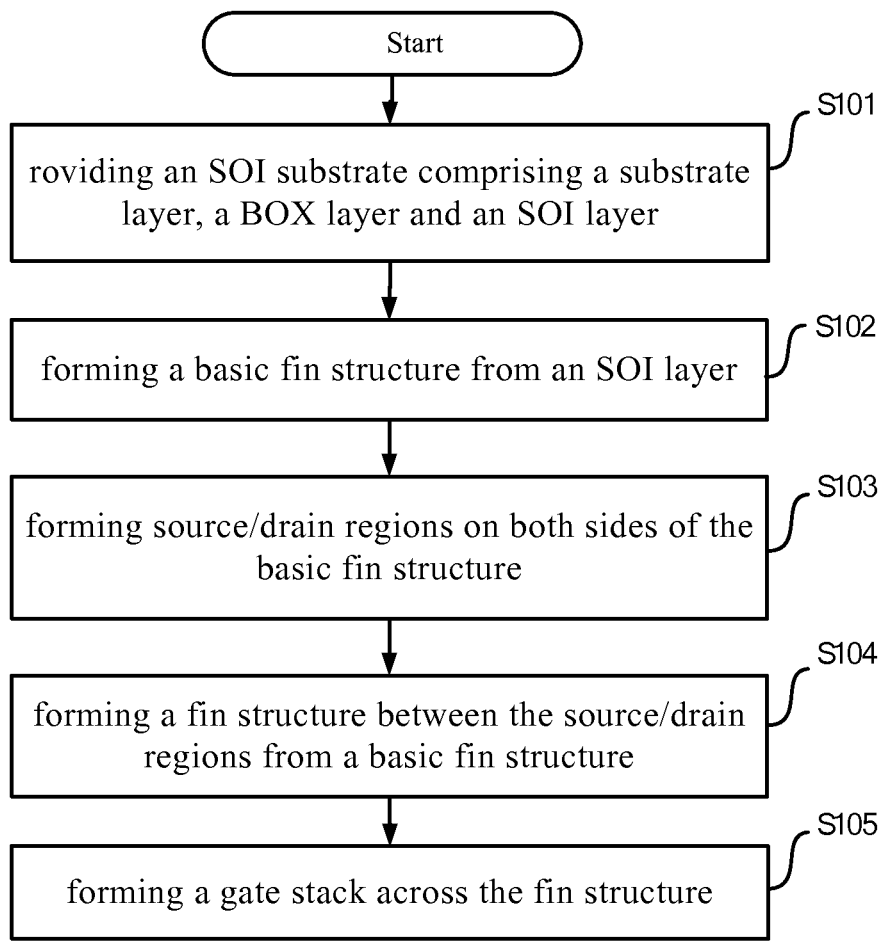
FIG. 1 is a flowchart according to an embodiment of a method for manufacturing a fin field effect transistor of the present invention.

To make the objects, technical solutions and advantages of the present invention more clear, the embodiments of the present invention are will be described in detail with reference to the drawings.

The embodiments of the present invention are described below in detail and the illustrative examples of the embodiments are shown in the drawings, wherein the same or similar reference numerals denote the same or similar elements or components having the same or similar functions throughout the drawings. The embodiments described with reference to the drawings are exemplary for explaining the present invention only, and cannot be construed as limiting the present invention.

The following disclosure provides many different embodiments or examples used to achieve different structures of the present invention. In order to simplify the disclosure of the present invention, members of specific examples and settings thereof will be described hereinafter. Of course, they are merely exemplary, and are not intended to limit the present invention. In addition, numbers and/or letters in the present invention can be repeated in different examples. Such repetition is for the purpose of simplification and clarity, and does not indicate the relationship between the various embodiments and/or settings discussed. Further, the present invention provides examples of a variety of particular processes and materials, but those skilled in the art may be aware of the applicability of other processes and/or the use of other materials. In addition, the structure where the first feature is "above" the second feature described below may include an embodiment where the first and second features are formed to be in direct contact, and may also include an embodiment where additional features are formed between the first and second features, so that the first and second features may not be in direct contact. It should be noted that the parts illustrated in the drawings are not necessarily drawn to scale. The description of well-known components and processing technologies and processes are omitted in the present invention to avoid unnecessarily limiting the present invention.

The method of manufacturing a fin field effect transistor provided in the present invention generally includes:

Step S101, providing an SOI substrate comprising a base layer, a BOX layer and an SOI layer;

Step S102, forming a basic fin structure from an SOI layer;

Step S103, forming source/drain regions on both sides of the basic fin structure;

Step S104, forming a fin structure located between source/drain regions from a basic fin structure; and Step S105, forming a gate stack across the fin structure.

Hereinafter, with reference to FIGS. 2 to 16 and in connection with a specific embodiment of the method for manufacturing a semiconductor structure provided in the present invention, various steps are further described in detail.

Figure 2:
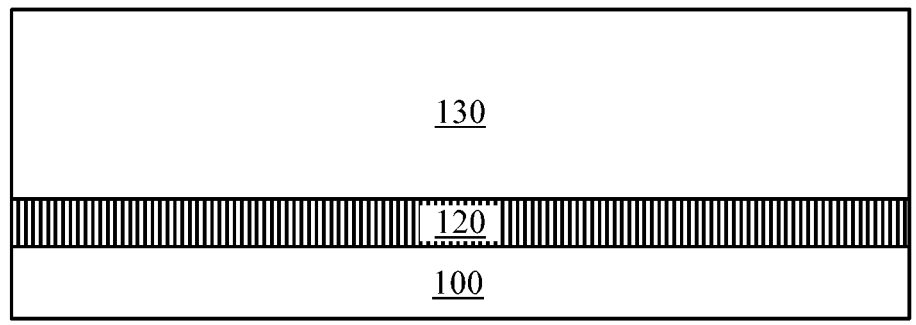
FIG. 2 illustrates a cross-sectional view of a substrate used in an embodiment of the method for manufacturing a fin field effect transistor of the invention.

Step S101, as shown in FIG. 2, there is provided an SOI substrate having at least a three-layer structure, which may comprise: a substrate layer 100 (e.g., a bulk silicon layer, wherein FIG. 2 only shows part of the substrate layer 100), a BOX layer 120 on the substrate layer 100, and an SOI layer 130 covering the BOX layer 120, respectively. The the BOX layer 120 is generally made of $SiO_2$. The material of the SOI layer 130 is a monocrystalline silicon, germanium or Group III-V compound (such as silicon carbide, gallium arsenide, indium arsenide or indium phosphide, etc.). The SOI substrate in the present embodiment is an ultrathin SOI layer 130. Thus, the thickness of the SOI layer 130 can be in the range of 20 nm to 100 nm, for example, 20 nm, 50 nm or 100 nm.

The step S102 is performed, wherein a basic fin structure is formed from an SOI layer. In this specific embodiment, a basic fin structure having a certain length is formed from an SOI layer 130, wherein the basic fin structure is covered with a first dielectric layer 150.

Figure 3:
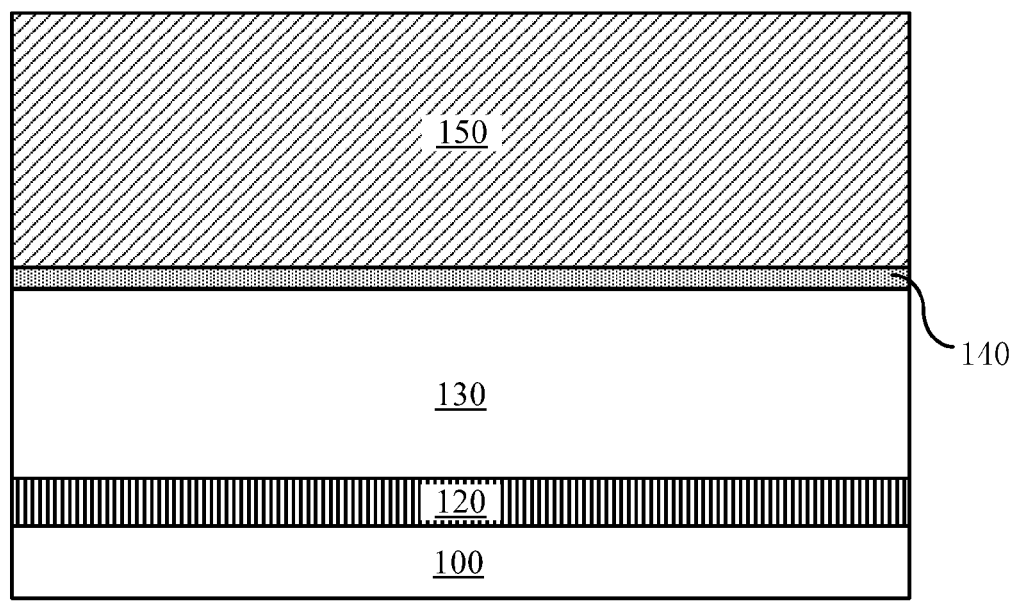
FIG. 3 illustrates a cross-sectional view after forming various material layers required for manufacturing a fin field effect transistor on a substrate in an embodiment of the method for manufacturing a fin field effect transistor of the invention.

As shown in FIG. 3, a third dielectric layer 140 and a first dielectric layer 150 are sequentially formed on the SOI substrate. A third dielectric layer 140 and the first dielectric layer 150 may be sequentially formed on the SOI layer 130 by Chemical Vapor Deposition (CVD), high-density plasma CVD, Atomic Layer Deposition (ALD), Plasma Enhanced Atomic Layer Deposition (PEALD), Pulse Laser Deposition (PLD), or other suitable methods. The material of the third dielectric layer 140 may be $SiO_2$, with a thickness between 2 nm and 5 nm, e.g., 2 nm, 4 nm, or 5 nm. The material of the first dielectric layer 150 may be $Si_3N_4$, with a thickness between 50 nm and 150 nm, e.g., 50 nm, 100 nm, or 150 nm.

Figure 4:
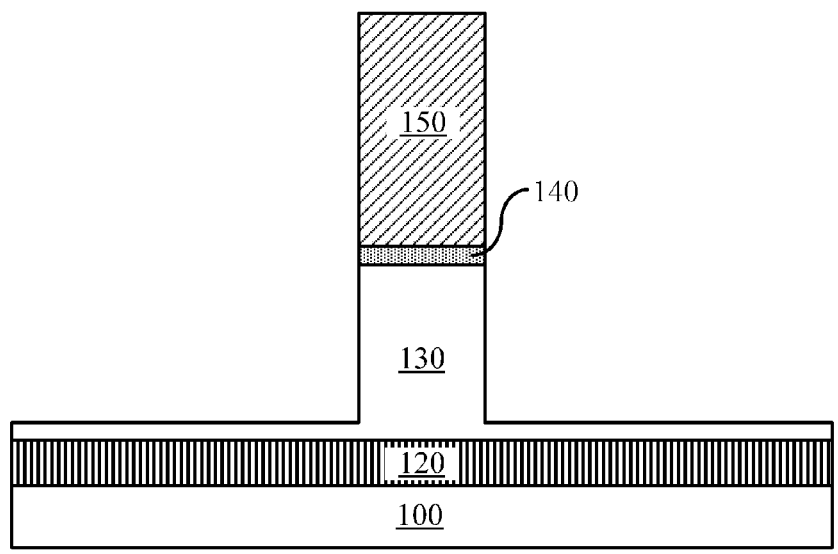
FIG. 4 illustrates a cross-sectional view after etching the semiconductor structure illustrated in FIG. 3.

For example, a photoresist pattern is formed on the first dielectric layer 150, where the pattern of the photoresist layer corresponds to that of the basic fin structure, for example, a strip having a length extending in the width direction of the semiconductor structure (the length direction in the present invention is the horizontal direction as shown in various sectional views, and the width direction is the direction perpendicular to the plane of various sectional views; and the length direction corresponds to the length direction of the basic fin structure, the fin structure to be formed and the semiconductor device channel). Therefore, the patterned photoresist layer is used as a mask to etch most part of the first dielectric layer 150, the third dielectric layer 140 and the SOI layer 130, and the etching stops at a lower portion of the SOI layer 130, so as to form a shape having a higher middle portion and lower side portions, as shown in FIG. 4. Herein the projected portion on the SOI layer formed by etching is referred to as a basic fin structure, and is covered by a third dielectric layer 140 and a first dielectric layer 150. As described below, the basic fin structure is used in the subsequent steps to form fins. The etching process may be achieved, for example, by plasma etching.

In other embodiments, a first dielectric layer 150 and a third dielectric layer 140 may not be formed.

Step S103 is performed, where source/drain regions are formed on both sides of the basic fin structure. In this specific embodiment, source/drain regions 110 are formed on both sides of the basic fin structure in the length direction, and the source/drain regions are covered by a second dielectric layer 160, wherein the material of the second dielectric layer is different from that of the first dielectric layer. After the above etching steps, a very thin layer of the SOI layer 130 on both sides of the basic fin structure further remains after etching for epitaxial growth thereon to form source/drain regions 110, and the source/drain regions can be slightly higher than the upper surface of the third dielectric layer 140. For example, the source/drain regions 110 may be source/drain regions made of stress materials. For example, for PMOS devices, the material of the source/drain region 110 may be $Si_{1-x}Ge_x$ (X may range from 0.15 to 0.75, and can be flexibly adjusted according to process requirements, such as 0.15, 0.3, 0.4, 0.5 or 0.75; and the values of X may be determined as described above if not indicated otherwise, and detailed description is omitted herein). For NMOS devices, the material of the source/drain region 110 may be Si:C (the percentage of the number of C atom may be 0.5% to 2%, such as 0.5%, 1% or 2%, and the content of C atom can be flexibly adjusted according to process requirements; and the values of the percentage of the number of C atom may be determined as described above if not indicated otherwise, and detailed description is omitted herein). The source/drain regions 110 may be in-situ doped during the process of epitaxial growth, and/or the source/drain regions 110 may be subjected to ion implantation, and annealed to activate the dopants. For PMOS devices, ions such as B may be implanted. For NMOS devices, As or P may be implanted. The source/drain region 110 may further adjust the stress of the fin structure basic fin structure, thereby adjusting the stress within the fin to be subsequently formed from a fin structure basic fin structure so as to enhance the mobility of the carriers in the channel region within the fin.

Figure 5:
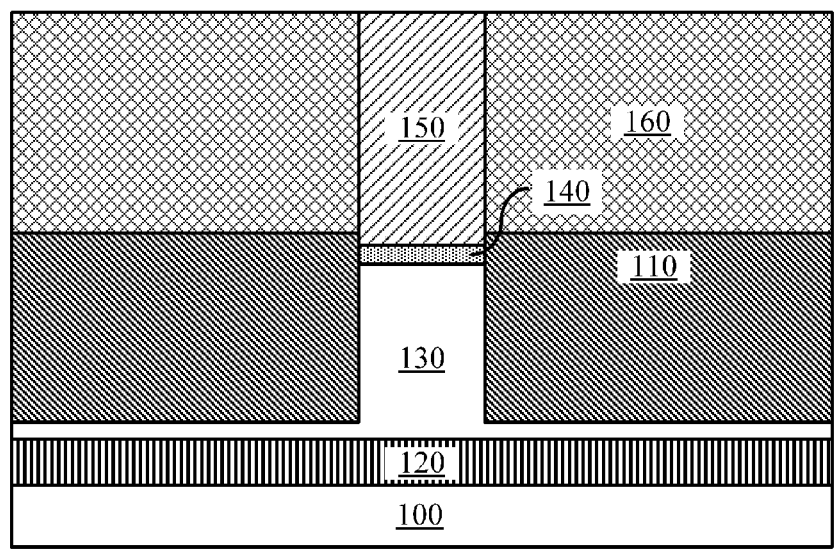
FIG. 5 illustrates a cross-sectional view of the semiconductor structure illustrated in FIG. 4 after epitaxial growth and deposition of oxides.

Then, a second dielectric layer 160 can be formed on the entire semiconductor structure. The material of the second dielectric layer is different from that of the first dielectric layer 150. For example, when the material of the first dielectric layer 150 is $Si_3N_4$, the second dielectric layer 160 may be an oxide layer. A second dielectric layer 160 can be formed by chemical vapor deposition, high-density plasma CVD, atomic layer deposition, plasma enhanced atomic layer deposition, pulse laser deposition or other suitable methods. Planarizing operation is performed after forming a second dielectric layer 160 to stop on the first dielectric layer 150. As shown in FIG. 5, a second dielectric layer 160 covering the source/drain region 110 is formed, the upper surface of the second dielectric layer 160 is at the same level as that of the first dielectric layer 150.

Figure 6:
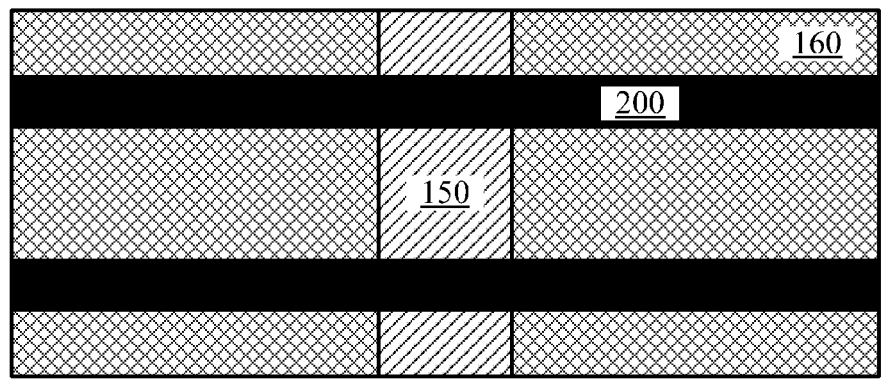
FIG. 6 illustrates a cross-sectional view after forming a photoresist pattern on the semiconductor structure illustrated in FIG. 5.

Step S104 is performed, wherein a fin structure located between source/drain regions is formed from a basic fin structure. In this embodiment, source/drain regions 110 on both sides of the basic fin structure in the length direction and a fin structure in the trench constituted by the second dielectric layer 160 along the length direction are formed from a basic fin structure. For example, a patterned photoresist layer 200 is formed on the semiconductor structure 200, for example, patterning can be carried out by spin coating, or exposure and development, and the place where a fin is intended to be formed is protected, as shown in FIG. 6. The material of the photoresist layer can be a vinyl monomer material, a material containing an azide quinone compound or a polyethylene monolaurate material.

Figure 7:
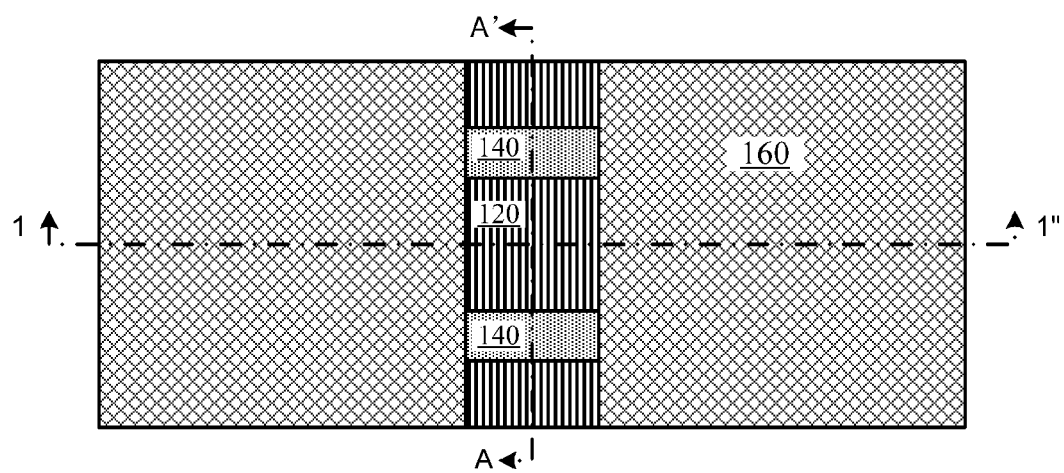
FIG. 7 illustrates a cross-sectional view after etching the semiconductor structure illustrated in FIG. 6.
Figure 8:
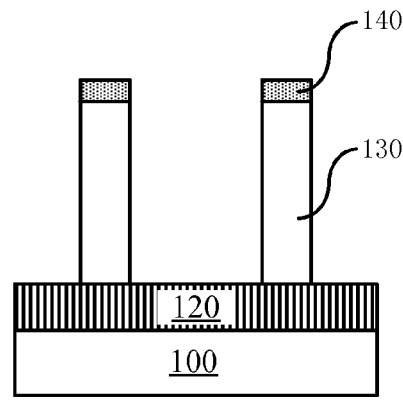
FIG. 8 illustrates a cross-sectional view of the semiconductor structure illustrated in FIG. 7 along the A-A' direction.
Figure 9:
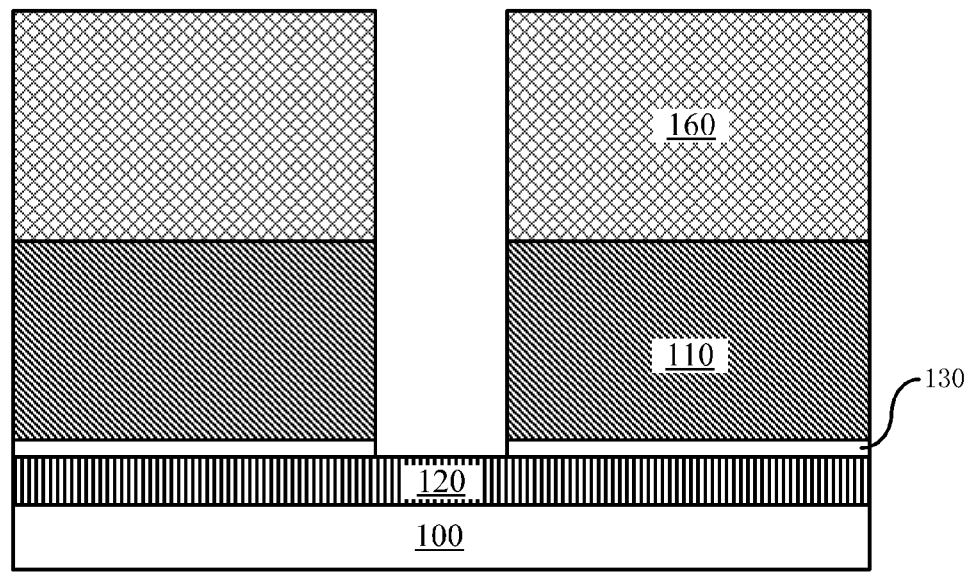
FIG. 9 illustrates a cross-sectional view of the semiconductor structure illustrated in FIG. 7 along the 1-1" direction.

The patterned photoresist layer 200 is used as a mask to etch the first dielectric layer 150, the third dielectric layer 140, and the SOI layer 130, and the etching stops on the upper surface of the BOX layer 120. Afterwards, the patterned photoresist layer 200 and then the first dielectric layer 150 below are removed, and the operation stops on the upper surface of the third dielectric layer 140, as shown in FIG. 7, FIG. 8, and FIG. 9, so as to form source/drain regions 110 on both sides and a fin structure (fin) extending along the length direction in the trench constituted by the second dielectric layer 160.

Figure 10:
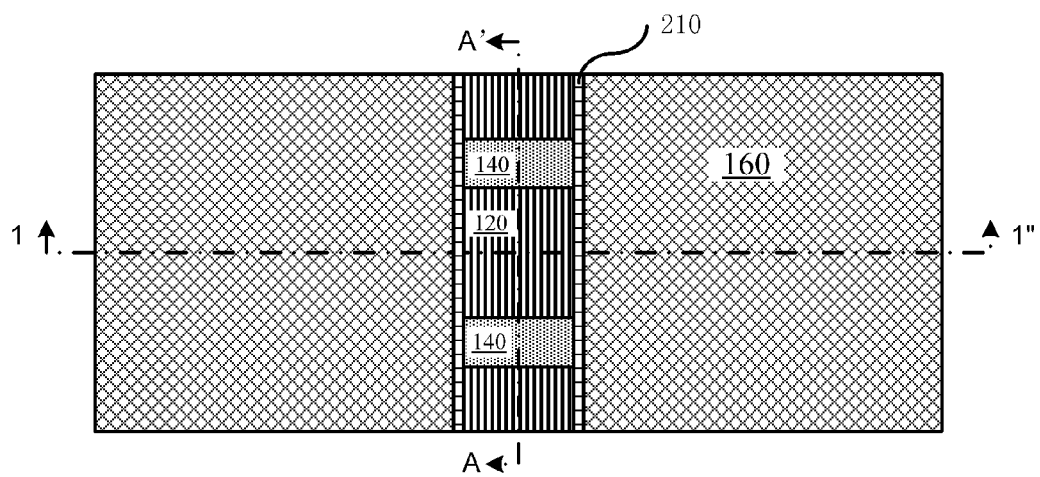
FIG. 10 illustrates a cross-sectional view after spacers are formed on the semiconductor structure illustrated in Figure.
Figure 11:
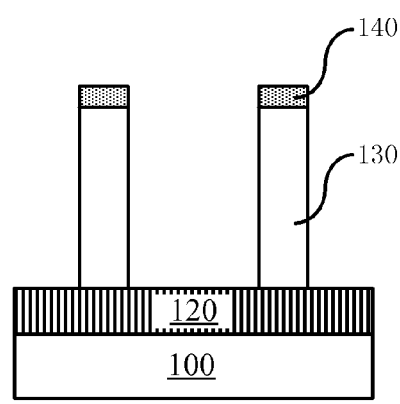
FIG. 11 illustrates a cross-sectional view of the semiconductor structure illustrated in FIG. 10 along the A-A' direction.
Figure 12:
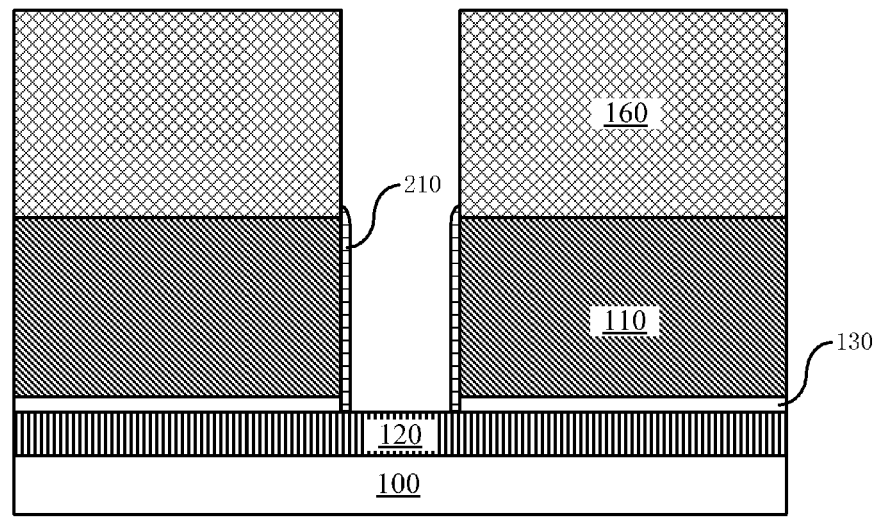
FIG. 12 illustrates a cross-sectional view of the semiconductor structure illustrated in FIG. 10 along the 1-1" direction.

In this specific embodiment, a spacer may also be formed on the SOI layer exposed in the trench and the sidewalls of the source/drain region 110. A spacer 210 is formed on both sides of the source/drain region 110, as shown in FIGS. 10, 11 and 12. The spacer 210 can be formed by silicon nitride, silicon oxide, silicon oxynitride, silicon carbide, and any combination thereof, and/or other suitable materials. The spacer 210 may have a multilayer structure. The spacer 210 may be formed by a process comprising a deposition etching process, and its thickness can range from 5 nm to 10 nm, for example, 5 nm, 8 nm, or 10 nm. The spacer 210 is at least higher than the source/drain region 110. No spacer is formed on the fin structure.

Figure 13:
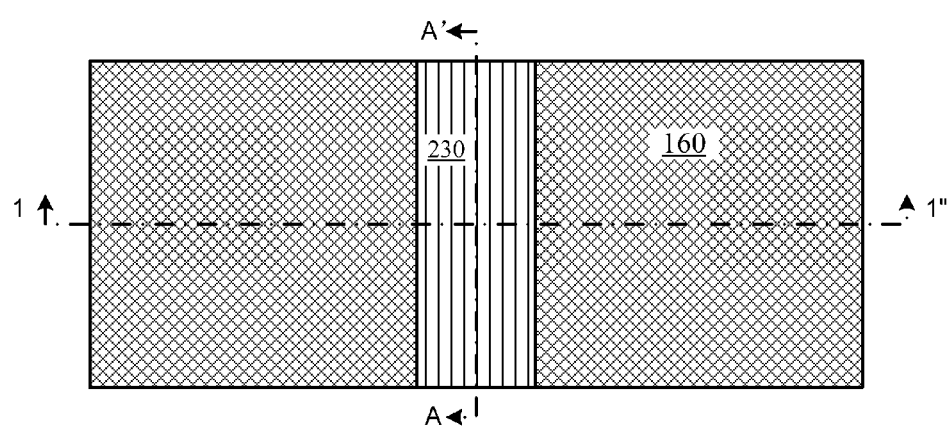
FIG. 13 illustrates a cross-sectional view after a metal layer is formed on the semiconductor structure illustrated in FIG. 10.
Figure 14:
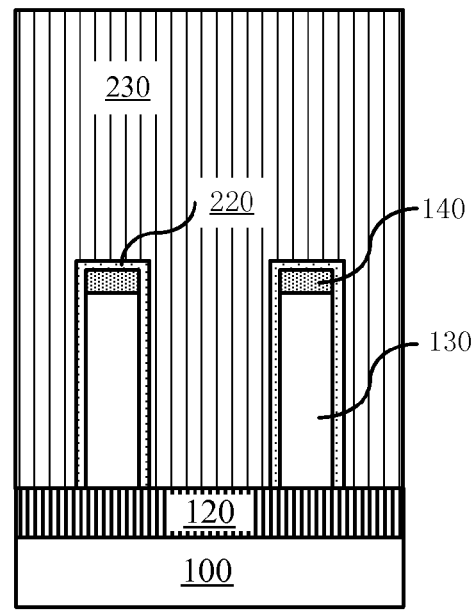
FIG. 14 illustrates a cross-sectional view of the semiconductor structure illustrated in FIG. 13 along the A-A' direction.
Figure 15:
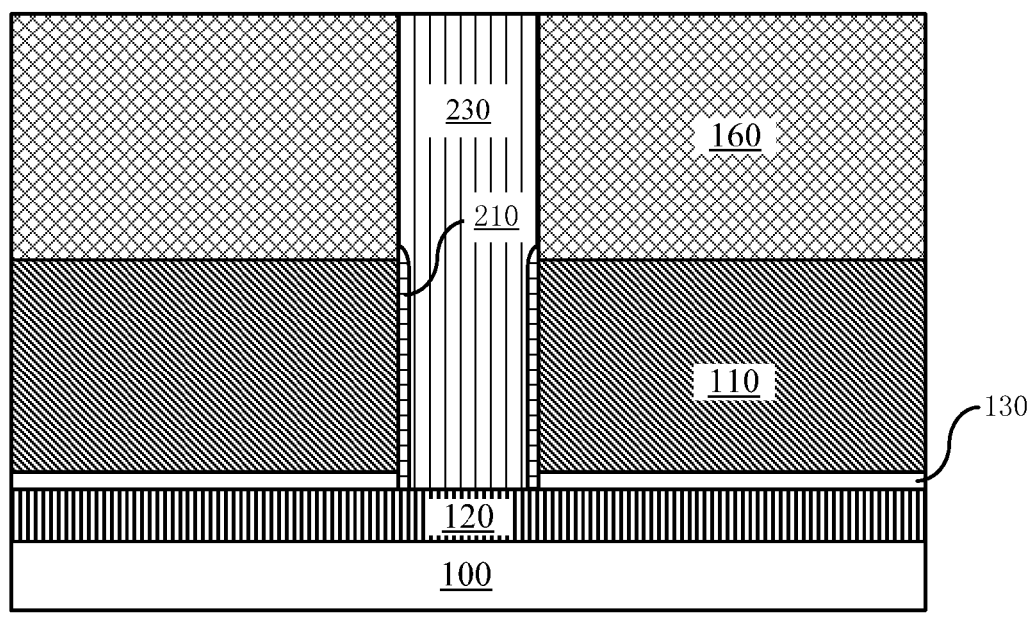
FIG. 15 illustrates a cross-sectional view of the semiconductor structure illustrated in FIG. 13 along the 1-1" direction.
Figure 16:
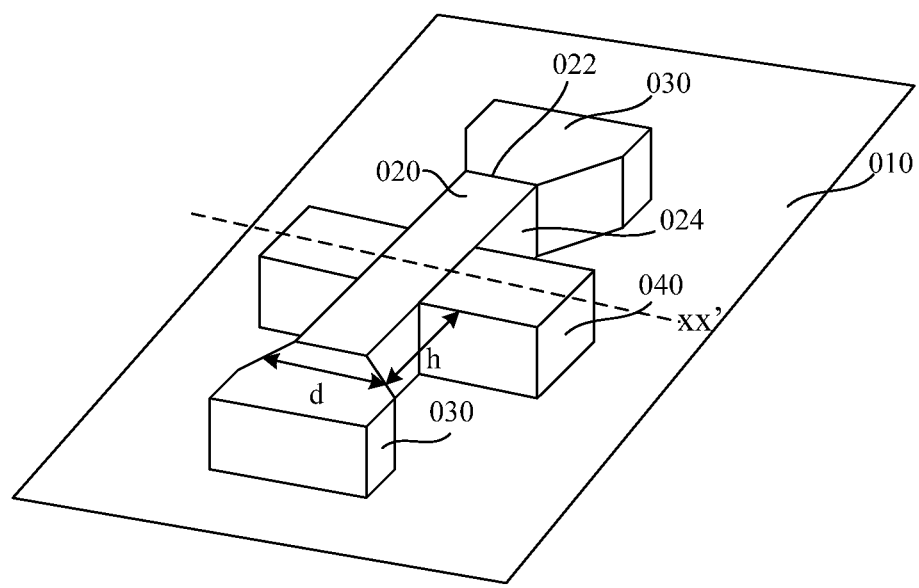
FIG. 16 is a schematic view of a fin field effect transistor in the prior art.

Step S105 is performed, wherein a gate stack is formed across the fin structure. In this embodiment, a gate dielectric layer 20 covering the fin structure and a gate metal layer 230 covering the gate dielectric layer 220 are formed in the trench. A gate dielectric layer 220 (e.g., a high-k dielectric layer) covering the entire semiconductor structure 220 is formed; and then, a metal layer 230 (e.g., a Vt tuning metal layer) is deposited on the gate dielectric layer 220 to form a gate metal layer 230. Planarizing is carried out so that the upper surface of the gate metal layer 230 in the trench is at the same level as the upper surface of the second dielectric layer 160, as shown in FIG. 13, FIG. 14, and FIG. 15. The gate metal layer 230 on other regions except the recessed region is removed. The high-k dielectric may be, for example, one of HfAlON, HfSiAlON HfTaAlON HfTiAlON, HfON, HfSiON, HfTaON, HfTiON, or any combination thereof, and preferably HfO$_2$. The gate dielectric layer 220 may have a thickness of 2 nm to 4 nm, for example, 2 nm, 3 nm or 4 nm. The gate dielectric layer 220 can be formed by processes such as thermal oxidation, chemical vapor deposition, atomic layer deposition, etc. The metal layer may be one of TaN, TaC, TiN, TaAlN, TiAlN, MoAlN, TaTbN, TaErN, TaYbN, TaSiN, HfSiN, MoSiN, RuTax, NiTax, or any combination thereof.

In other embodiments, thermally oxidized gate dielectric layer and polysilicon gate can also be formed.

In the method of manufacturing a fin field effect transistor provided in the present invention, source/drain regions 110 are firstly formed and then a fin is formed, where the high-k gate dielectric and the metal gate can be integrated into the fin field effect transistor to reduce the short channel effect of the device, thereby facilitating the improvement of the performance of the semiconductor device. Furthermore, the strained source/drain regions formed depending on the device types can apply different stress to the fin according to the device types, thereby increasing the mobility of the channel carrier.

The structure of the fin field effect transistor manufactured according to the above method is summarized as follows.

The fin field effect transistor structure comprises: an SOI substrate comprising an SOI layer 130, a BOX layer 120 and a substrate layer 100;

a fin formed from a portion of the SOI layer 130;

source/drain regions 110 located on both sides of the fin and extending in the width direction of the fin, the fin being located in the trench formed by the extended source/drain regions 110, wherein a spacer 210 is formed on the portion of the source/drain regions 110 unconnected to the fin;

a gate dielectric layer 220 covering the fin; and a gate metal layer 230 covering the gate dielectric layer.

The SOI substrate is a three-layer structure which comprises a substrate layer 100, a BOX layer 120 located on the substrate layer 100, and an SOI layer 130 covering the BOX layer 120, respectively. The BOX layer 120 is generally made of SiO$_2$. The material of the SOI layer 130 is a monocrystalline silicon, germanium or Group III-V compound (such as silicon carbide, gallium arsenide, indium arsenide or indium phosphide, etc.). The SOI substrate in the present embodiment may have an ultra-thin SOI layer 130. Thus, the thickness of the SOI layer 130 can be in the range of 20 nm to 100 nm, for example, 20 nm, 50 nm or 100 nm.

The source/drain regions 110 are located on the SOI layer 130 with both sides of the fin etched, it being slightly higher than the upper surface of the third dielectric layer 140. For PMOS devices, the material of the source/drain regions 110 may be Si$_{1-x}$Ge$_x$ (X may range from 0.15 to 0.75, which can be flexibly adjusted according to process requirements, such as 0.15, 0.3, 0.4, 0.5 or 0.75; the values of X may be determined as described above if not indicated otherwise, and detailed description thereof is omitted herein). For NMOS devices, the material of the source/drain regions 110 may be Si:C (the percentage of the number of C atom may be 0.5% to 2%, such as 0.5%, 1% or 2%, and the content of C atom can be flexibly adjusted according to process requirements; the values of the percentage of the number of C atom may be determined as described if not indicated otherwise, and detailed description thereof is omitted herein). The source/drain regions 110 may further adjust the stress within the channel region in the fin so as to enhance the mobility of the carrier within the channel region.

The second dielectric layer 160 is located on the source/drain regions 110, and the material of the second dielectric layer 160 may be SiO$_2$.

The spacer 210 is located on both sides of the source/drain regions 110 for separating the source/drain regions 110 from the gate stack formed thereafter, and therefore it is at least higher than the source/drain regions 110. The spacer 210 can be formed by silicon nitride, silicon oxide, silicon oxynitride, silicon carbide, or any combination thereof, and/or other suitable materials. The spacer 210 may have a multi-layer structure. The thickness of the spacer 210 may range from 5 nm to 10 nm, for example, 5 nm, 8 nm, or 10 nm.

The fin includes an SOI layer 130 and a third dielectric layer 140 thereon. The material of the first oxide layer is SiO$_2$. The thickness is between 2 nm and 5 nm, e.g., 2 nm, 4 nm, or 5 nm.

The gate dielectric layer 220 (e.g., a high-k dielectric layer) covers the fin. The high-k dielectric may be, for example, one of HfAlON, HfSiAlON HfTaAlON HfTiAlON, HfON, HfSiON, HfTaON, HfTiON, or any combination thereof, and preferably HfO$_2$. The gate dielectric layer 220 may have a thickness of 2 nm to 4 nm, for example, 2 nm, 3 nm or 4 nm.

The gate metal layer 230 (for example, a Vt tuning metal layer) covers the gate dielectric layer 220. The gate metal layer 230 may include one of TaN, TaC, TiN, TaAlN, TiAlN, MoAlN, TaTbN, TaErN, TaYbN, TaSiN, HfSiN, MoSiN, RuTax, NiTax, or any combination thereof.

While the exemplary embodiments and advantages thereof have been described in detail, it should be understood that various changes, substitutions and modifications can be made to these embodiments without departing from the spirit of the invention and the scope defined by the appended claims. For other examples, those skilled in the art should readily understand that the order of process steps can be varied without departing from the scope of the present invention.

In addition, the application of the present invention is not limited to the processes, institutions, manufacturing, composition of matter, means, methods and steps of the specific embodiments described in the description. In accordance with the disclosure of the present invention, those skilled in the art may readily understand that as for the processes, institutions, manufacturing, composition of matter, means, methods, or steps currently existing or to be developed later in which they implement substantially the same function or achieve substantially the same result as the corresponding embodiments descried in the present invention, they can be applied in accordance with the present invention. Accordingly, the appended claims of the present invention seek to include these processes, institutions, manufacturing, composition of matter, means, methods, or steps within the scope of its protection.

The invention claimed is:

1. A method of manufacturing a fin field effect transistor, comprising:
   a) providing an SOI substrate comprising a substrate layer (100), a BOX layer (120) and an SOI layer (130);
   b) forming a basic fin structure from the SOI layer;
   c) forming source/drain regions (110) on both sides of the basic fin structure;
   d) forming a fin structure between the source/drain regions (110) from the basic fin structure;
   e) forming a gate stack across the fin structure;
   wherein:

in the step b), the basic fin structure is covered with a first dielectric layer (150);

in the step c), the source/drain regions (110) are formed on both sides of the basic fin structure in a length direction, and the source/drain regions are covered with a second dielectric layer (160), wherein a material of the second dielectric layer is different from that of the first dielectric layer;

in the step d), the source/drain regions (110) on both sides of the basic fin structure in the length direction and the fin structure between the second dielectric layer (160) along the length direction are formed from the basic fin structure;

and step f) is performed before the step e): in the step f), a spacer (210) is formed on sidewalls of the SOI layer (130) exposed and the source/drain regions (110); and in the step e), a gate dielectric layer (220) covering the fin structure and a gate metal layer (230) covering the gate dielectric layer in a trench are formed.

2. The method according to claim 1, wherein the source/drain regions (110) are stressed source/drain regions.

3. The method according to claim 1, wherein in the step b), a portion of the SOI layer remains on both sides of the basic fin structure, and in the step c), the source/drain regions (110) are formed by epitaxial growth.

4. The method according to claim 3, wherein if the fin field effect transistor is a PMOS device, then the material of the source/drain regions (110) is SiGe, and the ratio of Ge element is within the range of 15%-75%.

5. The method according to claim 3, wherein when if the fin field effect transistor is an NMOS device, then the material of the source/drain regions (110) is SiC, and the ratio of C element is within the range of 0.5%-2%.

6. The method according to claim 1, wherein a third dielectric layer (140) is further formed between the basic fin structure and the first dielectric layer (150).

7. The method according to the method of claim 1, wherein the step d) includes:
   forming a mask having a certain width extending along the length direction to cover a specific position of the basic fin structure in the width direction;
   removing the portion of the basic fin structure that is not covered by the mask until the BOX layer (120) is exposed; and
   removing the mask and the first dielectric layer (150) below the mask (200).

8. The method according to claim 1, wherein the step e) comprises:
   depositing the gate dielectric layer (220) to cover the semiconductor structure;
   depositing the gate metal layer (230) to cover the gate dielectric layer (220); and
   performing a planarizing operation to remove the gate metal layer (230) covering regions except the trench;
   wherein the gate dielectric layer (220) in the gate stack is a high-k dielectric layer and the gate metal layer (230) includes a Vt tuning metal.

9. The method according to claim 1, wherein the source/drain regions (110) are higher than the basic fin structure.

* * * * *